United States Patent [19]
Gheorghiu

[11] Patent Number: 5,524,243
[45] Date of Patent: Jun. 4, 1996

[54] PARALLEL PROGRAMMING OF FIELD PROGRAMMABLE GATE ARRAY DEVICES

[75] Inventor: Florin Gheorghiu, San Jose, Calif.

[73] Assignee: Rolm Company, Santa Clara, Calif.

[21] Appl. No.: 430,695

[22] Filed: Apr. 28, 1995

Related U.S. Application Data

[63] Continuation of Ser. No. 292,710, Aug. 19, 1994, abandoned, which is a continuation of Ser. No. 991,662, Dec. 16, 1992, abandoned.

[51] Int. Cl.[6] .................................................. G06F 13/00
[52] U.S. Cl. ............................................................ 395/650
[58] Field of Search ....................................... 395/650, 700

[56] References Cited

U.S. PATENT DOCUMENTS

| 4,236,207 | 11/1980 | Rado et al. ........................ 364/DIG. 1 |
| 4,825,054 | 4/1989 | Rust et al. ............................... 235/380 |
| 4,949,299 | 8/1990 | Pickett ............................... 364/DIG. 2 |
| 4,967,340 | 10/1990 | Dawes ............................... 364/DIG. 1 |
| 5,166,557 | 11/1992 | Chen et al. ................................ 307/468 |
| 5,208,491 | 5/1993 | Ebeling et al. ........................ 307/465 |
| 5,256,918 | 10/1993 | Suzuki .................................... 307/410 |
| 5,319,598 | 6/1994 | Aralis et al. ....................... 365/189.12 |
| 5,428,800 | 6/1995 | Hsieh et al. ............................. 395/775 |
| 5,440,453 | 8/1995 | Cooke et al. ............................. 257/202 |

*Primary Examiner*—Kevin A. Kriess
*Assistant Examiner*—John O. Chavis

[57] ABSTRACT

Method and apparatus for rapidly configuring several field programmable gate arrays ("CFPGAs"), some of which FPGAs are of different sizes. In accordance with the present invention, the configuration is provided to each FPGA in parallel, on a bit-wise basis. Further, the different sizes of FPGA are accommodated by utilizing dummy bits in the configuration data. Still further, the configuration process can be completed at different times, i.e., the completion times of the configuration process can be staggered, by use of dummy bits in the configuration data.

21 Claims, 3 Drawing Sheets

PARALLEL PROGRAMMING OF FIELD PROGRAMMABLE GATE ARRAY DEVICES

This is a continuation of Ser. No. 08/292,710 filed Aug. 19, 1994, now abandoned, which is a continuation of Ser. No. 07/991,662 now abandoned filed on Dec. 16, 1992.

FIELD OF THE INVENTION

This invention generally relates to field programmable gate array "CFPGA") devices. Specifically, the invention concerns an apparatus and method for rapidly programming several devices in parallel.

BACKGROUND OF THE INVENTION

Field programmable gate arrays are application-specific integrated circuits (popularly known as "ASICs") that can be configured by the user to perform desired logic functions. In the devices of interest here, the configuration data is stored in static RAM cells and therefore volatile.

Generally speaking, there are two instances where an FPGA would be programmed. The first instance is when one is beginning from a cold start. In this case, there will be a power-on reset after which the device is devoid of data. The device may also lack configuration data if there has been a power disturbance causing the device's memory to fail.

The second instance is during normal operation, when the power is on and the device already contains a specific configuration. In this case, the user may desire to reprogram the device with the same or a different configuration. The reprogramming request will erase the existing configuration and the device is then reloaded.

To use an FPGA, one must first configure the device to achieve the desired logical arrangement. Internally, as the configuration data is received, the FPGA serializes the data, accepting the data and performing the configuration bit-by-bit.

One method of configuring an FPGA is known as the master serial mode. Here, one uses a special serial PROM specifically programmed (e.g., burned in with a PROM programmer) with the configuration data. The contents of the PROMs are customarily generated using development tools provided by the FPGA manufacturer. During the configuration operation, the FPGA reads in the PROM's contents bit by bit through the configuration data input. In the master serial mode, the timing and control signals of the configuration operation are controlled by the FPGA. This arrangement requires one PROM per FPGA. Where there are several devices, overall component cost and real estate requirements will increase.

Another method is known as the slave serial mode. It is similar to the netaster serial mode in that it uses the same control signals and also provides the configuration data to the FPGA one bit at a time. However, the FPGA no longer controls the operation. Instead, timing and control of signals during the configuration operation is performed by circuitry external to the FPGA.

Another technique of configuring FPGAs is the master parallel mode. As with the master serial mode, the FPGA controls the timing and control signals for the operation. However, the FPGA reads the configuration data from an 8-bit PROM one byte at a time instead of one bit at a time. Nevertheless, because the FPGA then serializes the data for internal utilization, this method of configuring the FPGA ultimately requires the same amount of time as the master serial mode.

Another scheme for configuring FPGAs is the peripheral mode. In this mode, a microprocessor extracts data from a PROM and writes it to a byte-wide I/O port or memory address channeled to the FPGA. The FPGA internally serializes the configuration data and signals the processor when it is ready for the next byte.

A commonly-used method for configuring multiple devices is to connect them in a daisy chain. The lead device in the chain may be configured in any of the four modes outlined above. It fetches or receives its-configuration data in serial or parallel fashion, as determined by the configuration mode, until its configuration memory is full. Then, the first device passes the succeeding data to the next device and so on. In this daisy chain configuration, the devices are programmed one at a time, greatly increasing the total time required to complete the configuration of all of the devices.

Ideally, a programming method would achieve the following goals. First, it would require minimum component cost. Second, the method would afford a low latency, i.e., minimal overall programming time. Third, the preferred way of configuring the FPGAs would have the lowest board real estate requirement.

SUMMARY OF THE INVENTION

These and other objects are achieved by the invention which provides a cost and time efficient means for concurrently programming multiple field programmable gate arrays, irrespective of size. Although the discussion here will focus on programming eight devices, a greater or lesser number of FPGAs could be programmed using the invention.

The FPGAs treat incoming configuration data as a serial bit stream, handling the data one bit at a time. Even though one could provide multi-bit words to each device, as in the master parallel mode, each individual FPGA is incapable of processing the data at any greater rate. Thus, no advantage is achieved by providing more than one bit to the FPGA per clock cycle.

In the scheme of the invention, a microprocessor extracts data from a PROM or other suitable storage means one byte (i.e., 8 bits) at a time and writes the data to its I/O port. Then, each bit is routed to a different FPGA. In the time required to read all of the bytes and send the respective bits to the FPGAs, all of the FPGAs will have been programmed. Therefore, the invention allows one to program several FPGAs in the time otherwise needed to program a single device.

The invention permits the user to employ any suitable, available memory—a dedicated PROM is not required. Thus, the memory holding configuration data may also hold other data (e.g., firmware for the microprocessor) reducing component cost and circuit board real estate requirements.

Another aspect of the invention is the ability to concurrently program FPGAs of unequal size. Additionally, the invention permits one to stagger the loading of the configuration data to delay startup and prevent surges on the board, or provide specific activation sequences to avoid logic contention and unknown hardware states.

BRIEF DESCRIPTION OF THE DRAWINGS

A more complete understanding of the present invention, as well as other objects and advantages thereof not enumerated herein, will become apparent upon consideration of the following detailed description and the accompanying drawings, wherein.

DETAILED DESCRIPTION OF THE INVENTION

The discussion here centers around the Xilinx family of programmable array devices, also known as Field Programmable Gate Arrays "CFPGAs"), which may contain anywhere from 2000 to 9000 gates. They are available from Xilinx, 2100 Logic Drive, San Jose, Calif. These components are described in detail in the 1992 Xilinx Programmable Gate Array Databook. Of course, one may employ ,other similarly-functioning devices.

Figure 1:
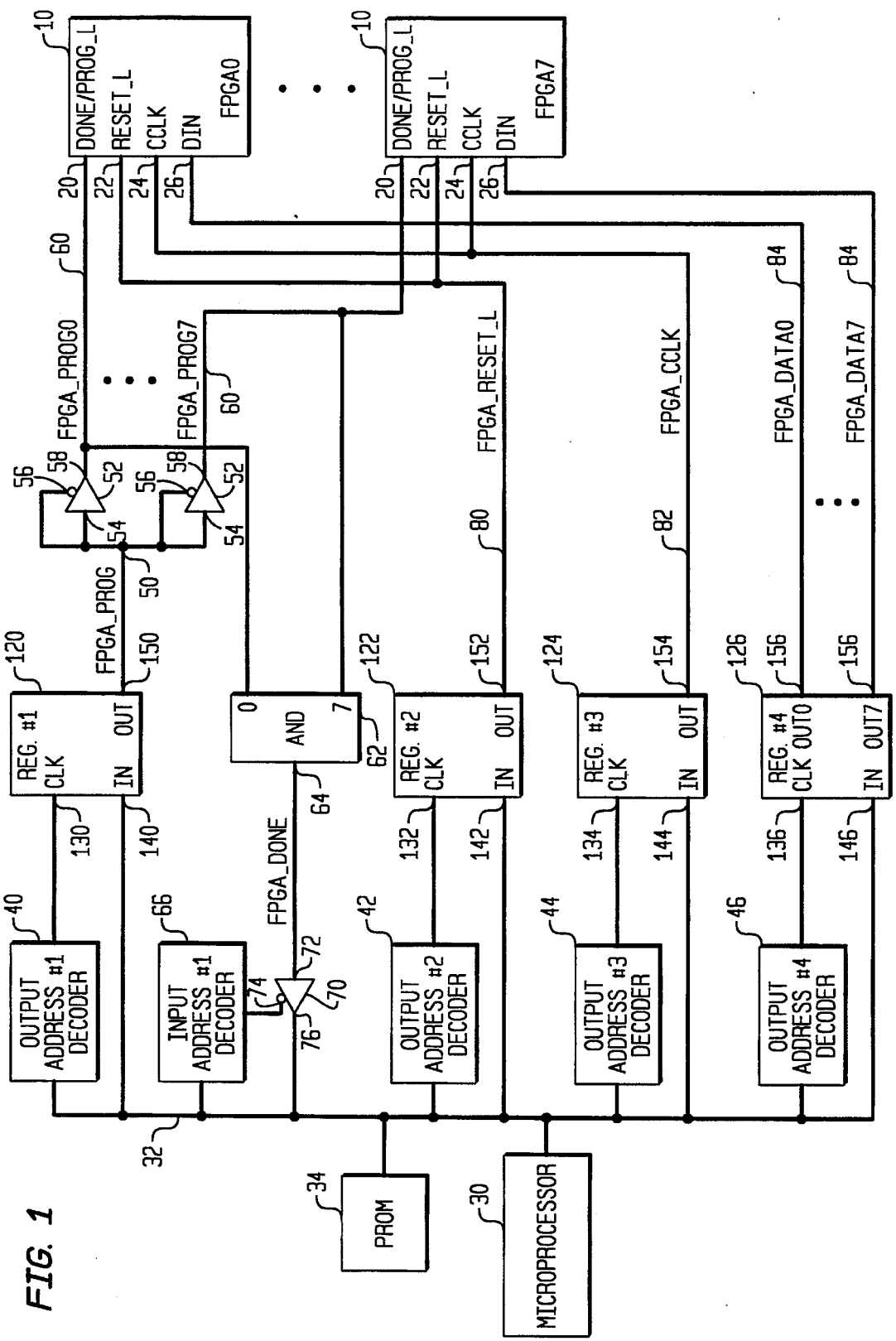
FIG. 1 is a schematic block diagram of the programming apparatus.

The FPGAs 10 are shown in block form in FIG. 1. Each FPGA 10 has a bidirectional DONE/PROG_L port 20, a RESET_L input 22, a CCLK input 24, and a DIN input 26.

The States of the FPGA

Figure 2:
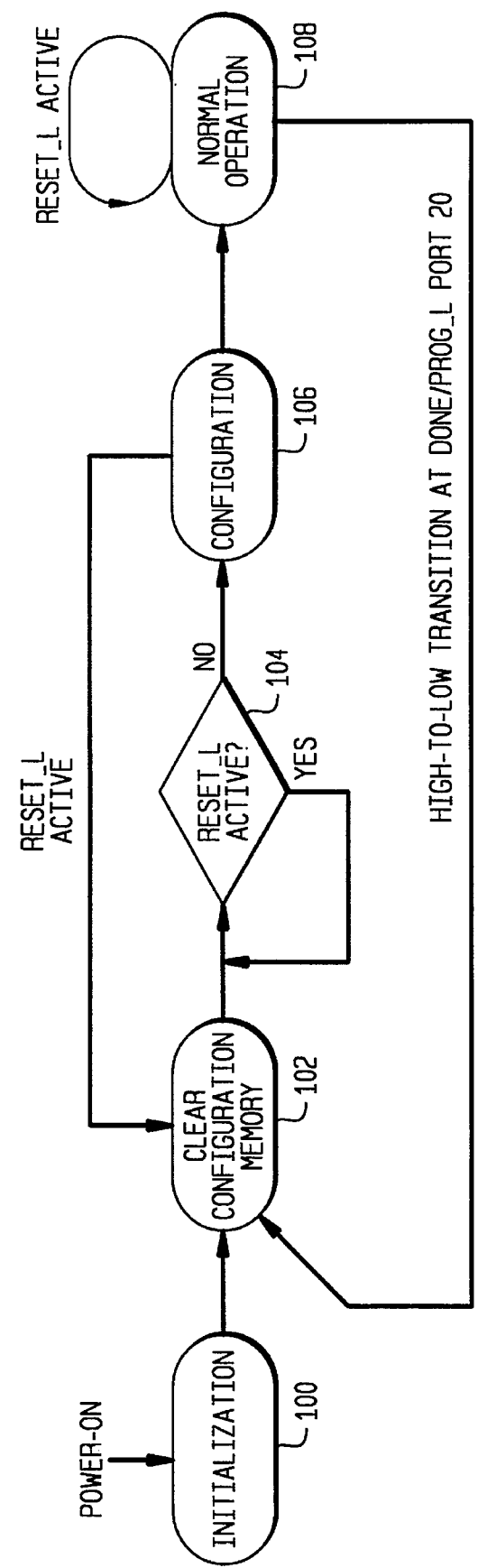
FIG. 2 is a state diagram of the programming phase of the programmable array.

By way of background, the Xilinx FPGA has five states: initialization 100, clear state 102, wait for RESET_L inactive 104, configuration 106, and normal 108, as shown in the state diagram of FIG. 2. The first mentioned state, initialization 100, occurs when the applied $V_{cc}$ exceeds 2.5 volts, e.g., following a power-on or a power glitch (interruption). In this state, the FPGA 10 provides a time-out delay to stabilize the device. Following initialization 100, the FPGA 10 enters the clear state 102, during which it clears its configuration memory. This phase lasts approximately 200–750/μsec., depending on the device and its size.

The wait for RESET_L inactive state 104 is an intermediate stage preceding the actual process of configuration. The FPGA 10 remains in this state for as long as RESELL input 22 remains low. The FPGA 10 enters the configuration state 106 when RESET_L input 22 goes high. With the FPGA 10 set for the slave serial mode, the configuration data is read in during the configuration state 106 bit-by-bit with each low-to-high transition at the CCLK input 24. Thus, to read in all of the data, the FPGA 10 must receive a sufficient number of bits from CCLK. Should the RESET_L input 22 goes active (i.e., low) at any time, the FPGA 10 returns to the clear state 102. This permits an abort of the configuration state 106 and clearing of the device 10.

Once the configuration has been loaded, the FPGA 10 enters its normal or operational state 108. During normal operation, the level at the bidirectional DONE/PROG_L port is high. The FPGA 10 will begin performing its function as configured and activates its I/O ports (not shown here). During this state, a high-to-low transition on DONE/PROG_L port 20 will return the FPGA 10 to the clear state 102. Also, an active level (low) on RESET_L input 22 during this state will reset all storage elements inside the FPGA 10 without changing the state of the FPGA 10.

FPGA Initialization

To configure an FPGA 10 using the invention, the device is placed in the slave serial mode. To do so, the three MODE pins M0, M1, and M2 (not shown) are set high (M0=M1=M2=1) through a pull-up or other suitable means. Then, the FPGA 10 is initialized by applying a high-to-low transition on DONE/PROG_L port 20, signifying a configuration request.

In the slave serial mode, the FPGA 10 takes a passive role and configuration control is transferred to devices external to the FPGA 10. The FPGA 10 expects to receive a clock signal on the CCLK input 24 and looks for configuration data on DIN input 26. In this embodiment, firmware in a microprocessor 30 provides the configuration clock CCLK and the configuration data for the FPGAs 10.

Through its firmware, the microprocessor 30 issues commands on bus 32 to output decoders ##1–4 (40, 42, 44, and 46), which are connected to output registers ##1–4 (120, 122, 124, and 126), respectively, at their clock inputs 130, 132, 34, and 136. The inputs 140, 142, 144, and 146 of the registers ##1–4 (120, 122, 24, and 126) are also tied to the bus 32.

The output 150 of the first register 120 is the program signal FPGA_PROG 50, connected to eight tri-state drivers 52 at signal inputs 54 and active-low tri-state control inputs 56. The outputs 58 of the tri-states 52 are eight FPGA status lines 60 which carry the program enable signals FPGA_PROG(0:7). Each of the program enable signals FPGA_PROG(0:7) are connected to a DONE/PROG_L port 20 of a respective FPGA 10.

FPGA Signals

Before turning to the operation of the circuit in FIG. 1, it will be helpful to define the various signals present in the circuit. When the output FPGA_PROG 50 is low, the tri-state drivers 52 are enabled, causing FPGA_PROG (0:7) to go low. On lines that were previously high (in configured and operational FPGAs), this initiates a reprogramming sequence, forcing the FPGA 10 to change states from the normal state 100 to the clear state 102.

If the FPGA_PROG 50 signal is high, the tri-state drivers 52 are disabled, allowing the FPGAs 10 to self-drive the FPGA status lines 60. The lines 60 will convey the outputs of the DONE/PROG_L ports 20 to the inputs of an AND gate 62, the output FPGA_DONE 64 of which is connected to the input 72 of a tri-state driver 70. The tri-state driver 70 is enabled at its control input 74 by the output of an input address decoder 66, passing the FPGA_DONE signal to the bus 32 for receipt by the microprocessor 30. In the first instance, the microprocessor 30 will poll the address representing the input address decoder 66 to initiate receipt of the FPGA_DONE signal, enabling the input address decoder 66. The presence of the FPGA_DONE signal indicates the completion of the configuration process.

The output 152 of output address register #2 (122), driven by output address decoder #2 (42) which itself is triggered by the firmware of the microprocessor 30, provides a reset signal labeled FPGA_RESET_L on reset line 80. This line 80 is connected to the RESET_L inputs 22 on each FPGA 10 to implement the reset function.

The clock signal for the FPGAs 10 is FPGA_CCLK 82. This signal is provided on a clock line 82 connected to the CCLK input 24 of each FPGA 10. It is generated by a series of 1's and 0's from the firmware to output address decoder #3 (44) that drives the clock input 134 of output address register #3 (124).

The configuration data is generated under firmware control. The files fi>r all of the FPGAs 10 are combined in parallel to create a string of bytes (of 8 bits each—at 1 bit per device; should there be a greater or lesser number of FPGAs, the bits are joined in words having the appropriate length). The microprocessor 30 provides the data to output address decoder #4 (46) which in turn drives the clock input 136 of register #4 (126), generating the data signals FPGA_DATA(0:7) at the register outputs 156. These are connected to respective DIN inputs 26 of the FPGAs 10 by eight data lines 84.

Operation of the FPGA Circuit

Figure 3:
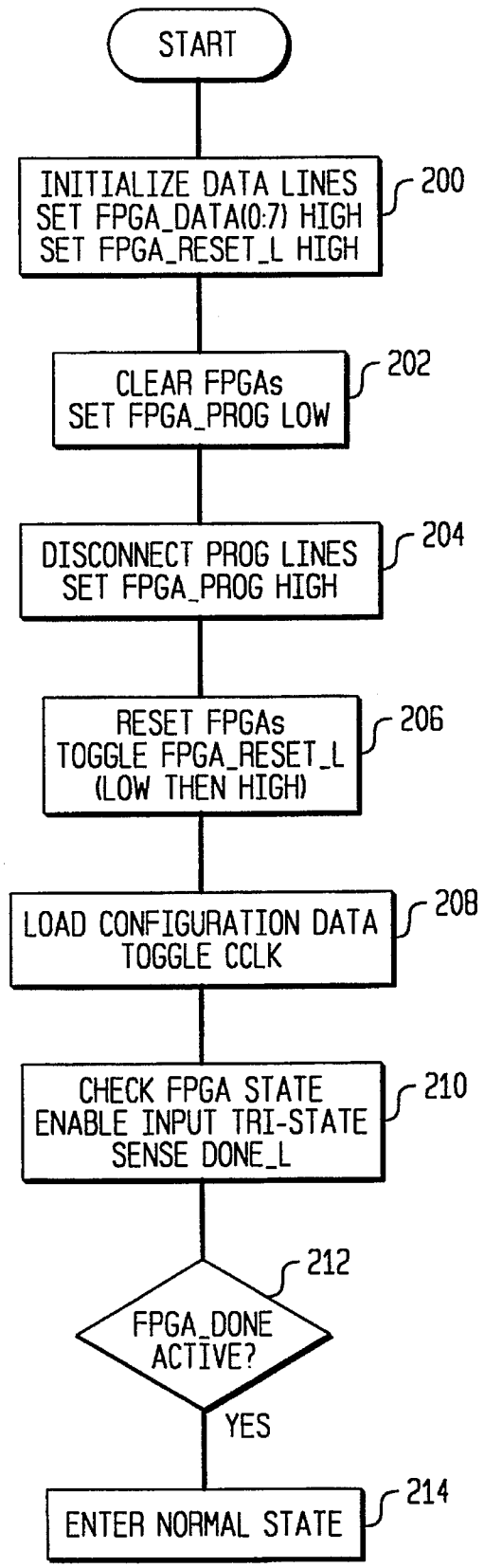
FIG. 3 is flow chart of the operation of the circuit of FIG. 1.

The operation of the circuit will be explained with reference to the flow chart in FIG. 3. The reference numerals in parentheses denote the blocks in the chart. To start, the data lines 84 are initialized by setting FPGA_DATA(0:7) high (200). Then, the microprocessor 30 sets FPGA_PROG to low for a set period. If an FPGA 10 was in the normal state 108, this will cause it to change to the clear state 102 by forcing the DONE_PROG_L port 20 low. The microprocessor 30 then sets FPGA_PROG 50 to high, disabling the tri-state drivers 52 and disconnecting; the program enable line 50 from the FPGA status lines 60 (202, 204).

However, if an FPGA 10 is initially in the configuration state 106, the preceding sequence of steps will not achieve a transition to the clear state 102. To do so, the FPGA_RESET_L signals are set low and then high. At this point, all of the FPGAs 10 will be in the clear state 102 (206). In addition, each FPGA 10 is driving its DONE/PROG_L port 20 low, hence resulting in the FPGA_DONE signal at the output 64 of the AND gate 62 being low.

After the clearing function has been completed, the configuration data can be loaded. The microprocessor 30 must provide sufficient CCLK transitions (and DIN bits) to fully configure the largest of the FPGAs 10 (208). When the configuration of an FPGA 10 is complete, the FPGA 10 enters the normal state 108 and the DONE/PROG_L port 20 will go high. This signal is conveyed back to the microprocessor 30 on the FPGA status lines 60, through the AND gate 62, the AND output line 64, and the tri-state driver 70 enabled by the input address decoder 66 (2 10). (Alternatively, the signal could be provided to the microprocessor 30 as eight status bits instead of as the single-line output of an AND gate.) When the microprocessor 30 confirms that FPGA_DONE is active (212), the system enters the normal state 108 (214).

Loading FPGAs of Differing Sizes

Normally, where there are eight devices, the bits would be combined in bytes of 8-bits, where each bit is a configuration bit for a designated FPGA 10. However, since the configuration data is loaded into the 7FPGAs 10 in parallel, there must be a way of simultaneously programming FPGAs of different sizes. This is accomplished by generating a data file that will accommodate the largest FPGA to be programmed. For example, assume that one FPGA 10 requires 64,000 configuration bits, but all of the others only need 32,000 configuration bits. The disparity in size is accounted for by placing dummy bits in the configuration data for the smaller devices, as specified by the manufacturer. In using FPGAs manufactured by Xilinx, these dummy bits may be placed in either the frame header or the postamble of the program data, or both.

Configuration Sequencing

To prevent power surges on the circuit board on which the FPGAs are mounted, or to provide a specific activation sequence to avoid logic contention or unknown hardware states, one can stagger or delay startup of the FPGAs by providing an offset in the stored bits of the configuration data for any given device. This is achieved by placing dummy bits ahead of valid configuration data, i.e., at the end of the header and by appropriately modifying the length count.

While there has been described what is believed to be the preferred embodiment of the invention, those skilled in the art will recognize that other and further modifications may be made thereto without departing from the spirit of the invention, and it is intended to claim all such embodiments that fall within the true scope of the invention. For example, one could program a different number of FPGAs using this invention. Also, one could use suitable FPGAs manufactured by a company other than Xilinx, substituting protocols other than those specified for the Xilinx devices.

What is claimed is:

1. A system comprising:
   a plurality of devices, each device including
   a serial data input port;
   a storage device;
   loading means, coupled to the storage device, for loading data portions of data into the storage device; and,
   transfer means, coupled to the storage-device and each of the plurality of device, for transferring in parallel from the storage device one bit of the data to the serial data input port of each of the plurality of devices, wherein each device receives a different bit of the data from the storage device.

2. A system as in claim 1 wherein each of the plurality of devices additionally includes a clock input and the transfer means includes a means for forwarding a first clock signal to the clock input of each of the plurality of devices each time the transfer means transfers one bit of data to the serial data input port of each of the plurality of devices.

3. A method as in claim 1 wherein the storage device is a single register.

4. A system as in claim 3, wherein there are eight devices and the single register is an eight-bit register.

5. A system as in claim 1 wherein:
   the data includes configuration information for each of the plurality of devices; and,
   each of the plurality of devices includes a means for ignoring dummy data so that when a first device in the plurality of devices requires a first amount of configuration information, a second device in the plurality of devices requires a second amount of configuration information, and the first amount is greater than the second amount, during data transfers in which the transfer means sends the first device the first amount of configuration data, the transfer means sends to the second device the second amount of configuration data plus first dummy data, so that the second amount plus the first dummy data is equal to the first amount.

6. A system as in claim 1 wherein each device is a field programmable gate array.

7. A method comprising the following step:
   (a) transferring first data to a plurality of devices, including the following substeps which are repeated until all the first data has been transferred:
      (a.1) loading a new data portion of the first data into a storage device, and
      (a.2) transferring, in parallel, one bit of the new data portion to each of the plurality of devices wherein each device receives a different bit of the new data portion.

8. A method as in claim 7 wherein substep (a.2) includes forwarding a first clock signal to a clock input of each of the plurality of devices.

9. A method as in claim 7 wherein in substep (a.1) the storage device is a single register.

10. A method as in claim 9, wherein there are eight devices in substep (a.1) the single register is an eight-bit register.

11. A method as in claim 7 wherein:
    the information is configuration information; and,
    when a first device in the plurality of devices requires a first amount of configuration information, a second device in the plurality of devices requires a second amount of configuration information, and the first amount is greater than the second amount, then in step (a), during data transfers in which the first device is sent the first amount of configuration information, sending to the second device the second amount of configuration information plus dummy data, so that the second amount plus the dummy data is equal to the first amount.

12. A method as in claim 11 wherein in step (a) the second device does not store the dummy data.

13. A method as in claim 7 wherein each device is a field programmable gate array.

14. A method to transfer information in parallel to be stored by a plurality of devices, the method comprising the steps of:

(a) placing a first segment of the information into a single register;

(b) in parallel, transferring a portion of the first segment to each of the plurality of devices wherein each of the plurality of devices gets a different portion of the first segment;

(c) placing a second segment of the information into the single register;

(d) in parallel, transferring a portion of the second segment to each of the plurality of devices wherein each of the plurality of devices gets a different portion of the second segment; and, (e) repeating steps (c) and (d) for new segments of the information until the information has been completely transferred.

15. A method as in claim 14 wherein in steps (b) and (d) each portion is one-bit.

16. A method as in claim 15, wherein there are eight devices and in steps (a) and (d) the single register is an eight-bit register.

17. A method as in claim 15 wherein in steps (b) and (d), each of the plurality of devices is in a serial input mode.

18. A method as in claim 17 wherein:

step (b) includes forwarding a first dock signal to each of the plurality of devices; and, step (d) includes forwarding a second clock signal to each of the plurality of devices.

19. A method as in claim 14 wherein:

the information is configuration information; and, when a first device in the plurality of devices requires a first amount of configuration information, a second device in the plurality of devices requires a second amount of configuration information, and the first amount is greater than the second amount, then in step (e), during data transfers in which the first device is sent the first amount of configuration information, sending to the second device the second amount of configuration information plus dummy data, so that the second amount plus the dummy data is equal to the first amount.

20. A method as in claim 19 wherein in step (e) the second device does not store the dummy data.

21. A method as in claim 14 wherein each device is a field programmable gate array.

* * * * *